(12) United States Patent
Hering et al.

(10) Patent No.: US 9,603,500 B2
(45) Date of Patent: Mar. 28, 2017

(54) DOMESTIC APPLIANCE

(71) Applicant: BSH Hausgeräte GmbH, Munich (DE)

(72) Inventors: Reinhard Hering, Holzheim (DE);
Paul Nistor, Dillingen (DE); Christian Wirth, Dillingen (DE)

(73) Assignee: BSH Huasgeräte GmbH, Munich (DE)

( * ) Notice: Subject to any disclaimer, the term of this patent is extended or adjusted under 35 U.S.C. 154(b) by 0 days.

(21) Appl. No.: 14/761,316

(22) PCT Filed: Jan. 27, 2014

(86) PCT No.: PCT/EP2014/051527
§ 371 (c)(1),
(2) Date: Jul. 16, 2015

(87) PCT Pub. No.: WO2014/118126
PCT Pub. Date: Aug. 7, 2014

(65) Prior Publication Data
US 2015/0359406 A1 Dec. 17, 2015

(30) Foreign Application Priority Data
Jan. 31, 2013 (DE) .......... 10 2013 201 575

(51) Int. Cl.
*H05K 7/00* (2006.01)
*A47L 15/00* (2006.01)
(Continued)

(52) U.S. Cl.
CPC ....... *A47L 15/0063* (2013.01); *A47L 15/4274* (2013.01); *D06F 33/02* (2013.01);
(Continued)

(58) Field of Classification Search
CPC .............. H05K 5/0217; D06F 33/02
(Continued)

(56) References Cited

U.S. PATENT DOCUMENTS 4,907,207 A * 3/1990 Moeckl .................. G10K 13/00
181/170
7,574,269 B2 * 8/2009 Cenedese ................ D06F 33/02
700/17
(Continued)

FOREIGN PATENT DOCUMENTS

CN 201086970 Y 7/2008
GB 2256580 A 12/1992
(Continued)

OTHER PUBLICATIONS

Report of Examination DE 10 2013 201 575.5 dated Nov. 11, 2011.
(Continued)

*Primary Examiner* — Dion R Ferguson
*Assistant Examiner* — Mandeep S Buttar
(74) *Attorney, Agent, or Firm* — Michael E. Tschupp; Andre Pallapies

(57) ABSTRACT

A domestic appliance includes a housing, a base support configured to support the housing on a floor, and a communication module configured to send and/or receive data wirelessly. The communication module is disposed within the base support, with the base support being made of plastic, at least in an area adjacent to the communication module.

14 Claims, 1 Drawing Sheet

(51) Int. Cl.
*A47L 15/42* (2006.01)
*D06F 39/12* (2006.01)
*D06F 33/02* (2006.01)
*H05K 5/02* (2006.01)
*H04W 4/00* (2009.01)
*H04W 84/12* (2009.01)

(52) U.S. Cl.
CPC ........... *D06F 39/12* (2013.01); *H05K 5/0217* (2013.01); *D06F 2210/00* (2013.01); *H04W 4/008* (2013.01); *H04W 84/12* (2013.01)

(58) Field of Classification Search
USPC ........................................................ 361/728
See application file for complete search history.

(56) References Cited

U.S. PATENT DOCUMENTS 8,327,862 B2* 12/2012 Haltmayer .......... A47L 15/4272
134/201

2010/0171430 A1* 7/2010 Seydoux ............ H05B 37/0272
315/159
2011/0271987 A1 11/2011 Jerg et al.
2012/0125366 A1* 5/2012 Beshears, Jr. ....... A47L 15/0047
134/18
2013/0031767 A1 2/2013 Haltmayer et al.

FOREIGN PATENT DOCUMENTS

| WO | 2004052168 A1 | 6/2004 |
| WO | 2007065778 A1 | 6/2007 |
| WO | 2011080146 A1 | 7/2011 |

OTHER PUBLICATIONS

International Search Report PCT/EP2014/051527 dated Mar. 27, 2014.
Report of Examination of CN 2014800061450 dated Aug. 22, 2016.

* cited by examiner

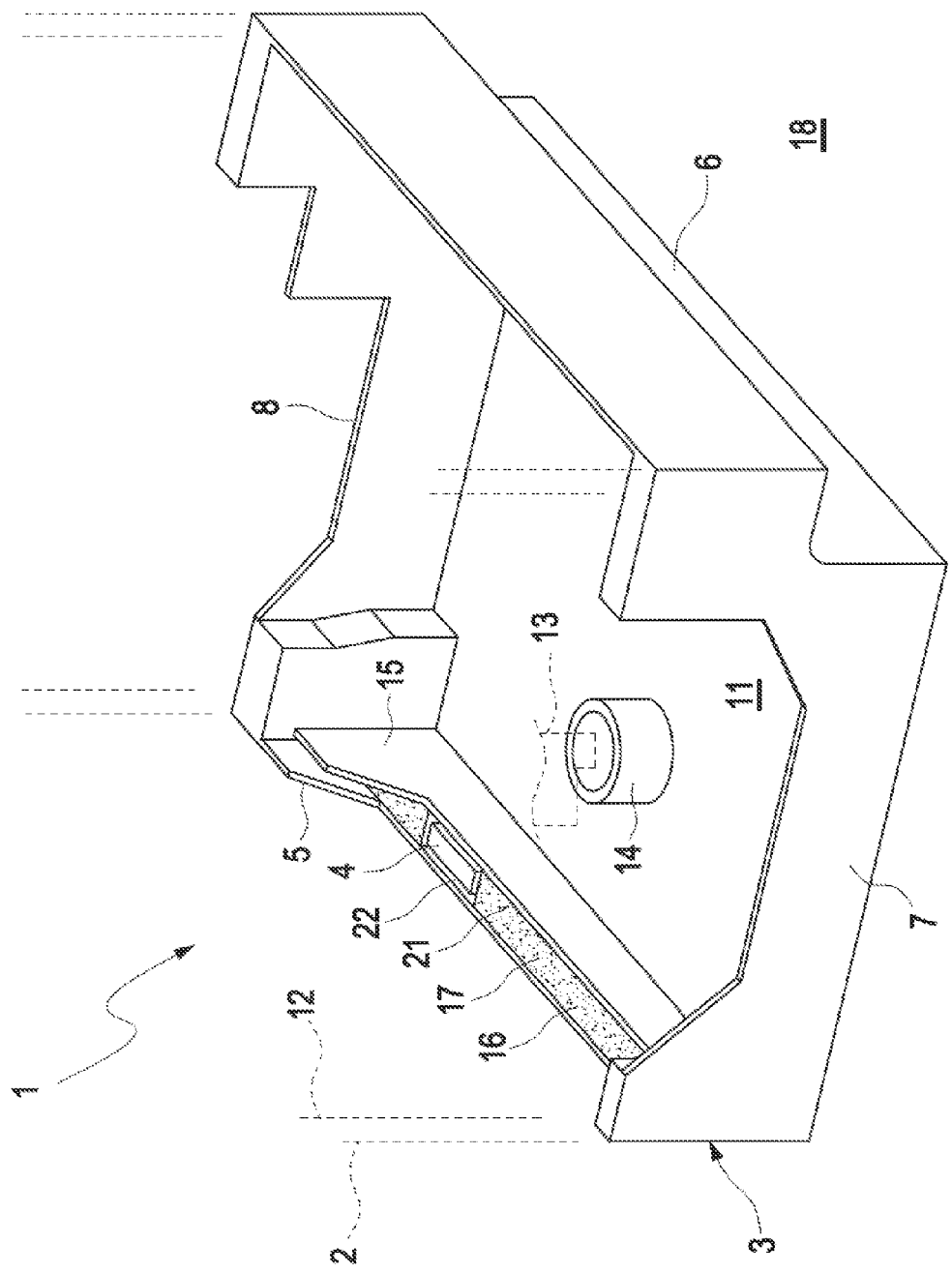

DOMESTIC APPLIANCE

BACKGROUND OF THE INVENTION

The present invention relates to a domestic appliance.

It is known to equip domestic appliances, such as refrigerators, washing machines, dishwashers or ovens for example, with communication modules. Said communication modules can firstly enable a data exchange between different domestic appliances. Furthermore, such communication modules can be provided to communicate with user terminals, such as smart phones. An operator thus can be informed of the progress of a washing program of a dishwasher by smart phone, for example.

WO 2011/080146 A1 describes a communication module for a dishwasher, for example. This is integrated into a front panel of the dishwasher.

Said communication modules should essentially be provided such that they are shielded by metal parts of the domestic appliance in particular as little as possible. This improves the range of an antenna integrated into the communication module and an exchange of data is thus now enabled. Furthermore, the communication modules should be able to be installed in a simple manner in different variants of the domestic appliance.

BRIEF SUMMARY OF THE INVENTION

In view of this, it is an object of the present invention to provide a domestic appliance which has a communication module that is as shielded as little as possible and has a large range as a result and furthermore is able to be installed in a simple manner in different variants of the domestic appliance.

Thus a domestic appliance with a housing, a base support and a communication module is proposed. The base support is embodied to support the housing on the floor. The communication module is designed to send and/or receive data wirelessly. The communication module is disposed within the base support.

In general, due to the construction of the housing and base support, there is only little shielding in the area of the base support. The range of a communication module arranged there is accordingly wide. Furthermore, the base support remains essentially unchanged in different variants of a domestic appliance or is present in every domestic appliance. Accordingly, the communication module can be accommodated in the base support in all variants. Thus, for example, there is the difficulty in WO 2011/080146 that the panel containing the communication module is not present in built-in appliances with skirting boards. Accordingly, the communication module must be accommodated elsewhere in such variants, which increases the complexity of the variant formation and may be accompanied by additional logistical costs.

"Within the base support" is intended to mean that the communication module is enclosed by the base support on all sides. This does not exclude sections of the communication module from projecting above the base support in variants. In particular, the communication module is fastened to the base support. For example, the communication module can be fastened to the base support by being inserted into a recess.

The base support is partially or completely made of plastic.

As a result, the base support is at least partially permeable to electromagnetic radiation, such that the communication module is only slightly shielded. In accordance with the invention the base support is embodied as made of plastic, at least in the area adjacent to the communication module.

According to a further form of embodiment, the communication module is disposed in the area of a front wall of the base support.

"Front wall" refers to the wall facing the operator during operation of the domestic appliance. The front wall, in contrast to the rear wall, is essentially free, i.e. not covered by a wall or the like, so that there is good reception for the communication module at this position. The communication module could, however, also essentially be disposed adjacent to another wall of the base support.

According to a further form of embodiment the front wall is formed of plastic.

As a result, in the area of the communication module a shielding thereof is minimized.

According to a further form of embodiment, the communication module is disposed between the front wall and a reinforcing rib of the base support.

By inserting the communication module into a gap between the front wall and the reinforcing rib, the communication module can be fastened to the base support in a simple manner.

According to a further form of embodiment the front wall and the reinforcing rib extend parallel to one another.

As a result, the communication module—depending on the variant of the domestic appliance—can be positioned differently in a simple manner by being moved in the gap between the front wall and the reinforcing rib, in order to take account of the particularities of specific variants. For example, the communication module can thus be moved to a position which is at a distance from a water-bearing hose, which could otherwise disrupt the reception of the communication module.

According to a further form of embodiment the communication module is disposed on or in a damping material.

This means that the communication module can be isolated from vibrations of the domestic appliance, which can have positive effects on the service life of the communication module. By accommodating the communication module in the damping material, the communication module can be accommodated in a space-saving manner.

According to a further form of embodiment the communication module is disposed in a recess in the damping material which is open at the top.

As a result, the communication module can be introduced into the recess from the top in a simple manner and thus fastened to the base support.

According to a further form of embodiment, the damping material is disposed between the front wall and the reinforcing rib.

In the gap formed between the front wall and the reinforcing rib, the damping material can be fastened in a simple manner.

According to a further form of embodiment, the base support comprises the front wall, a rear wall as well as two side walls, which are connected to each other at all ends and are each connected to a bottom plate to form a trough.

A trough of this kind is well suited to accommodate the corresponding components of the domestic appliance, especially a dishwasher cavity.

According to a further form of embodiment, the communication module is designed to communicate wirelessly with at least one other communication module of another domestic appliance or a user terminal.

The user terminal can be a smart phone, for example.

According to a further form of embodiment, the communication module is embodied as a WLAN or Bluetooth communication module.

According to a further form of embodiment, the domestic appliance is embodied as a dishwasher.

According to a further form of embodiment, the base support supports at least one water-bearing component in addition to the housing.

The water-bearing component can be a dishwasher cavity of a dishwasher, for example. Furthermore, the water-bearing component can be embodied as a sump which is fastened to the base support. Further still, the water-bearing component can be embodied as a hose which is held against the base support.

Further advantageous embodiments and aspects of the invention are the subject matter of the dependent claims as well as the exemplary embodiments of the invention described below. The invention is also described in greater detail on the basis of preferred forms of embodiment with reference to the attached figure.

BRIEF DESCRIPTION OF THE DRAWINGS

The single FIGURE shows a perspective sectional view of a dishwasher according to one form of embodiment.

DETAILED DESCRIPTION OF EXEMPLARY EMBODIMENTS OF THE PRESENT INVENTION

The domestic appliance in the form of a dishwasher 1 comprises a housing 2, which is only depicted schematically. The dishwasher 1 further comprises a base support 3, for example in the form of a trough. A communication module 4 of the domestic appliance 1 is disposed within the base support 3.

The base support 3 is embodied entirely out of plastic, for example. Polypropylene, for example, can be used as the plastic. The base support 3 comprises a front wall 5, which faces an operator in the installation position of the dishwasher 1. Furthermore, the base support 3 comprises a rear wall 6 opposite the front wall 5 as well as side walls 7 and 8. The walls 5, 6, 7, 8 are connected to one another at all ends. In addition, the walls 5, 6, 7, 8 are connected to a bottom plate 11 of the base support 3. The walls 5, 6, 7, 8 and the bottom plate 11 can in particular be formed in one piece, for example by an injection molding procedure. The trough thus formed serves as a support, in particular for the housing 2, a schematically indicated dishwasher cavity 12 for receiving items to be washed as well as different, in particular water-bearing, components of the dishwasher 1. By way of example, a sump 13 is shown which is fastened to a fastening section 14 on the bottom plate 11. Thus the base support 3 essentially supports all of the components of the dishwasher 1 on the floor 18 on which the dishwasher 1 is standing.

The base support 3 further has at least one reinforcing rib 15, which forms a gap 6 together with the front wall 5. The communication module 4 is inserted into the gap 16 and thus fastens to the base support 3. The reinforcing rib 15 can extend parallel to the front wall 5 and in particular be formed in one piece with the bottom plate 11. Depending on the variant, the communication module 4 can thus also be disposed at a position indicated with 17.

Furthermore, the gap 16 can be filled with a damping material in the form of a fleece 21. The fleece 21 has a recess 22 which is open at the top, into which the communication module 4 is introduced.

The communication module 4 can be designed to communicate wirelessly with communication modules of other domestic appliances, such as an oven, or with a user terminal in the form of a smart phone. Here, the communication module forms a WLAN (Wireless Local Area Network) with other communication modules or the user terminal. The wireless communication can take place via Bluetooth, for example. In this case, the communication module 4 has an installation position in which it is only slightly shielded or is not shielded at all, so that it has a wide range. In particular, it is easy for electromagnetic radiation to penetrate the front wall 5 made of plastic.

Although the present invention has been described on the basis of exemplary embodiments, it can be modified in diverse ways.

The invention claimed is:

1. A domestic appliance, comprising:
    a housing;
    a base support configured to support the housing on a floor, the base support comprising a front wall, a rear wall and two side walls, and a reinforcing rib disposed proximate to but spaced apart from the front wall so as to form a space between the front wall and the reinforcing rib; and
    a communication module configured to send and/or receive data wirelessly, said communication module being disposed within the base support, with the base support being made of plastic, at least in an area adjacent to the communication module,
    wherein the communication module is disposed in an area of the front wall of the base support and is positioned in the space between the front wall and the reinforcing rib of the base support.

2. The domestic appliance of claim 1, wherein the base support is made entirely of plastic.

3. The domestic appliance of claim 1, wherein the front wall is made of plastic.

4. The domestic appliance of claim 1, wherein the front wall and the reinforcing rib extend parallel to one another.

5. The domestic appliance of claim 1, further comprising a damping material, said communication module being disposed on or in the damping material.

6. The domestic appliance of claim 5, wherein the damping material has an open-topped recess, said communication module being disposed in the recess.

7. The domestic appliance of claim 5, wherein the damping material is disposed in the space between the front wall of the base support and the reinforcing rib of the base support.

8. The domestic appliance of claim 5, wherein the damping material is made of fleece.

9. The domestic appliance of claim 1, wherein said front wall, rear wall, and two side walls are connected to each other at all ends, and further comprising a bottom plate connected to the front wall, rear wall and two side walls to form a trough.

10. The domestic appliance of claim 1, wherein the communication module communicates wirelessly with at least one other communication module of another domestic appliance or a user terminal.

11. The domestic appliance of claim 1, wherein the communication module is embodied as a WLAN or Bluetooth communication module.

12. The domestic appliance of claim 1, constructed in the form of a dishwasher.

13. The domestic appliance of claim 12, wherein the dishwasher has at least one water-bearing component, said base support supporting the at least one water-bearing component.

14. A domestic appliance, comprising: a housing; a base support which is a load bearing member that is configured to support the housing on a floor, the base support comprising a front wall, a rear wall, and two side walls; and a communication module configured to send and/or receive data wirelessly, said communication module being disposed within the base support, with the base support being made of plastic, at least in an area adjacent to the communication module, wherein the communication module is disposed in an area of the front wall of the base support; and further comprising a damping material, wherein the damping material has an open-topped recess, and said communication module being disposed in the recess.

* * * * *